(12) United States Patent
Jeddeloh (10) Patent No.: US 7,823,024 B2
(45) Date of Patent: *Oct. 26, 2010

(54) MEMORY HUB TESTER INTERFACE AND METHOD FOR USE THEREOF

(75) Inventor: Joseph M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 502 days.

This patent is subject to a terminal disclaimer.

(21) Appl. No.: 11/880,961

(22) Filed: Jul. 24, 2007

(65) Prior Publication Data

US 2007/0300105 A1    Dec. 27, 2007

Related U.S. Application Data

(63) Continuation of application No. 10/861,163, filed on Jun. 4, 2004, now Pat. No. 7,310,748.

(51) Int. Cl.
G06F 11/00    (2006.01)

(52) U.S. Cl. .......................................... 714/42; 714/54

(58) Field of Classification Search .................. 714/42, 714/54, 5, 48, 8
See application file for complete search history.

(56) References Cited

U.S. PATENT DOCUMENTS

| | | | |
|---|---|---|---|
| 4,045,781 A | 8/1977 | Levy et al. .................. 364/200 |
| 4,084,225 A | 4/1978 | Anderson et al. ........... 364/200 |
| 4,240,143 A | 12/1980 | Besemer et al. ............. 364/200 |
| 4,245,306 A | 1/1981 | Besemer et al. ............. 364/200 |
| 4,253,144 A | 2/1981 | Bellamy et al. ............. 364/200 |
| 4,253,146 A | 2/1981 | Bellamy et al. ............. 364/200 |
| 4,608,702 A | 8/1986 | Hirzel et al. ................ 375/110 |
| 4,707,823 A | 11/1987 | Holdren et al. ................ 370/1 |
| 4,724,520 A | 2/1988 | Athanas et al. ............. 364/200 |
| 4,891,808 A | 1/1990 | Williams .................... 370/112 |
| 4,930,128 A | 5/1990 | Suzuki et al. ................. 371/12 |
| 4,953,930 A | 9/1990 | Ramsey et al. ........... 350/96.11 |

(Continued)

FOREIGN PATENT DOCUMENTS

EP    0849685 A2    6/1998

(Continued)

OTHER PUBLICATIONS

"Free On-Line Dictionary of Computing" entry Flash Erasable Programmable Read-Only Memory, online May 17, 2004 [http://foldoc.doc.ic.ac.uk/foldoc/foldoc.cgi?flash+memory].

(Continued)

Primary Examiner—Dieu-Minh Le
(74) Attorney, Agent, or Firm—Dorsey & Whitney LLP (57) ABSTRACT

A memory hub including a memory test bridge circuit for testing memory devices. Test command packets are coupled from a tester to the memory hub responsive to a test clock signal having a test clock frequency. The test bridge circuit generates memory device command, address, and data signals in accordance with the test command packets, and the memory device command, address, and data signals are provided to a memory device under test that is coupled to the memory hub responsive to a memory device clock signal having a memory device clock frequency.

24 Claims, 5 Drawing Sheets

U.S. PATENT DOCUMENTS

| | | | |
|---|---|---|---|
| 5,123,016 A | 6/1992 | Muller et al. | 371/10.3 |
| 5,241,506 A | 8/1993 | Motegi et al. | 365/210 |
| 5,243,703 A | 9/1993 | Farmwald et al. | 395/325 |
| 5,251,303 A | 10/1993 | Fogg, Jr. et al. | 395/275 |
| 5,269,022 A | 12/1993 | Shinjo et al. | 395/700 |
| 5,274,584 A | 12/1993 | Henderson et al. | 365/49 |
| 5,287,343 A | 2/1994 | Nakamura et al. | 370/13.1 |
| 5,317,752 A | 5/1994 | Jewett et al. | 395/750 |
| 5,319,755 A | 6/1994 | Farmwald et al. | 395/325 |
| 5,327,553 A | 7/1994 | Jewett et al. | 395/575 |
| 5,349,587 A | 9/1994 | Nadeau-Dostie et al. | 371/22.3 |
| 5,355,391 A | 10/1994 | Horowitz et al. | 375/36 |
| 5,432,823 A | 7/1995 | Gasbarro et al. | 375/356 |
| 5,432,907 A | 7/1995 | Picazo, Jr. et al. | 395/200 |
| 5,442,770 A | 8/1995 | Barratt | 395/403 |
| 5,450,578 A | 9/1995 | Mackenthun | 395/182.02 |
| 5,461,627 A | 10/1995 | Rypinski | 370/95.2 |
| 5,465,229 A | 11/1995 | Bechtolsheim et al. | 345/477 |
| 5,479,370 A | 12/1995 | Furuyama et al. | 365/189.12 |
| 5,497,476 A | 3/1996 | Oldfield et al. | 395/439 |
| 5,502,621 A | 3/1996 | Schumacher et al. | 361/760 |
| 5,544,319 A | 8/1996 | Acton et al. | 395/200.07 |
| 5,566,325 A | 10/1996 | Bruce, II et al. | 395/494 |
| 5,572,722 A | 11/1996 | Vogley | 395/555 |
| 5,577,220 A | 11/1996 | Combs et al. | 395/416 |
| 5,581,482 A | 12/1996 | Wiedenmann et al. | 364/551.01 |
| 5,581,767 A | 12/1996 | Katsuki et al. | 395/800 |
| 5,606,717 A | 2/1997 | Farmwald et al. | 395/856 |
| 5,619,676 A | 4/1997 | Fukuda et al. | 395/464 |
| 5,621,739 A | 4/1997 | Sine et al. | 371/22.1 |
| 5,638,334 A | 6/1997 | Farmwald et al. | 365/230.03 |
| 5,659,798 A | 8/1997 | Blumrich et al. | 395/846 |
| 5,706,224 A | 1/1998 | Srinivasan et al. | 365/49 |
| 5,710,733 A | 1/1998 | Chengson et al. | 365/52 |
| 5,715,456 A | 2/1998 | Bennett et al. | 395/652 |
| 5,729,709 A | 3/1998 | Harness | 395/405 |
| 5,748,616 A | 5/1998 | Riley | 370/242 |
| 5,768,152 A | 6/1998 | Battaline et al. | 364/551.01 |
| 5,790,048 A | 8/1998 | Hsieh et al. | 340/825.79 |
| 5,793,776 A | 8/1998 | Qureshi et al. | 371/22.1 |
| 5,818,844 A | 10/1998 | Singh et al. | 370/463 |
| 5,819,304 A | 10/1998 | Nilsen et al. | 711/5 |
| 5,822,255 A | 10/1998 | Uchida | 365/194 |
| 5,832,250 A | 11/1998 | Whittaker | 395/471 |
| 5,875,352 A | 2/1999 | Gentry et al. | 395/843 |
| 5,875,454 A | 2/1999 | Craft et al. | 711/113 |
| 5,905,858 A | 5/1999 | Jeddeloh | 395/185.05 |
| 5,912,852 A | 6/1999 | Lawrence et al. | 365/201 |
| 5,914,902 A | 6/1999 | Lawrence et al. | 365/201 |
| 5,928,343 A | 7/1999 | Farmwald et al. | 710/104 |
| 5,959,914 A | 9/1999 | Gates et al. | 365/201 |
| 5,966,724 A | 10/1999 | Ryan | 711/105 |
| 5,973,935 A | 10/1999 | Schoenfeld et al. | 361/813 |
| 5,973,951 A | 10/1999 | Bechtolsheim et al. | 365/52 |
| 5,978,567 A | 11/1999 | Rebane et al. | 395/200.49 |
| 5,987,196 A | 11/1999 | Noble | 385/14 |
| 6,023,726 A | 2/2000 | Saksena | 709/219 |
| 6,029,250 A | 2/2000 | Keeth | 713/400 |
| 6,031,241 A | 2/2000 | Silfvast et al. | 250/504 R |
| 6,033,951 A | 3/2000 | Chao | 438/253 |
| 6,061,263 A | 5/2000 | Boaz et al. | 365/51 |
| 6,061,296 A | 5/2000 | Ternullo, Jr. et al. | 365/233 |
| 6,067,262 A | 5/2000 | Irrinki et al. | 365/201 |
| 6,073,190 A | 6/2000 | Rooney | 710/56 |
| 6,076,139 A | 6/2000 | Welker et al. | 711/104 |
| 6,079,008 A | 6/2000 | Clery, III | 712/11 |
| 6,098,158 A | 8/2000 | Lay et al. | 711/162 |
| 6,105,075 A | 8/2000 | Ghaffari | 710/5 |
| 6,125,431 A | 9/2000 | Kobayashi | 711/154 |
| 6,131,149 A | 10/2000 | Lu et al. | 711/167 |
| 6,134,624 A | 10/2000 | Burns et al. | 710/131 |
| 6,137,709 A | 10/2000 | Boaz et al. | 365/51 |
| 6,144,587 A | 11/2000 | Yoshida | 365/189.05 |
| 6,167,465 A | 12/2000 | Parvin et al. | 710/22 |
| 6,167,486 A | 12/2000 | Lee et al. | 711/120 |
| 6,173,388 B1 | 1/2001 | Abercrombie et al. | 712/22 |
| 6,175,571 B1 | 1/2001 | Haddock et al. | 370/423 |
| 6,185,352 B1 | 2/2001 | Hurley | 385/114 |
| 6,186,400 B1 | 2/2001 | Dvorkis et al. | 235/462.45 |
| 6,191,663 B1 | 2/2001 | Hannah | 333/17.3 |
| 6,201,724 B1 | 3/2001 | Ishizaki et al. | 365/49 |
| 6,205,564 B1 | 3/2001 | Kim et al. | 714/48 |
| 6,208,180 B1 | 3/2001 | Fisch et al. | 327/141 |
| 6,219,725 B1 | 4/2001 | Diehl et al. | 710/26 |
| 6,233,376 B1 | 5/2001 | Updegrove | 385/14 |
| 6,243,769 B1 | 6/2001 | Rooney | 710/56 |
| 6,243,831 B1 | 6/2001 | Mustafa et al. | 714/24 |
| 6,246,618 B1 | 6/2001 | Yamamoto et al. | 365/200 |
| 6,247,107 B1 | 6/2001 | Christie | 711/216 |
| 6,249,802 B1 | 6/2001 | Richardson et al. | 709/200 |
| 6,256,692 B1 | 7/2001 | Yoda et al. | 710/104 |
| 6,272,609 B1 | 8/2001 | Jeddeloh | 711/169 |
| 6,285,349 B1 | 9/2001 | Smith | 345/147 |
| 6,286,083 B1 | 9/2001 | Chin et al. | 711/151 |
| 6,294,937 B1 | 9/2001 | Crafts et al. | 327/158 |
| 6,301,637 B1 | 10/2001 | Krull et al. | 711/112 |
| 6,327,642 B1 | 12/2001 | Lee et al. | 711/120 |
| 6,330,205 B2 | 12/2001 | Shimizu et al. | 365/230.06 |
| 6,347,055 B1 | 2/2002 | Motomura | 365/189.05 |
| 6,349,363 B2 | 2/2002 | Cai et al. | 711/129 |
| 6,351,834 B1 | 2/2002 | Maekawa et al. | 714/718 |
| 6,356,573 B1 | 3/2002 | Jonsson et al. | 372/46 |
| 6,367,074 B1 | 4/2002 | Bates et al. | 717/11 |
| 6,370,068 B2 | 4/2002 | Rhee | 365/196 |
| 6,373,777 B1 | 4/2002 | Suzuki | 365/230.03 |
| 6,381,190 B1 | 4/2002 | Shinkai | 365/230.03 |
| 6,392,653 B1 | 5/2002 | Malandain et al. | 345/501 |
| 6,401,213 B1 | 6/2002 | Jeddeloh | 713/401 |
| 6,405,280 B1 | 6/2002 | Ryan | 711/105 |
| 6,421,744 B1 | 7/2002 | Morrison et al. | 710/22 |
| 6,430,696 B1 | 8/2002 | Keeth | 713/503 |
| 6,434,639 B1 | 8/2002 | Haghighi | 710/39 |
| 6,434,696 B1 | 8/2002 | Kang | 713/2 |
| 6,434,736 B1 | 8/2002 | Schaecher et al. | 716/17 |
| 6,438,622 B1 | 8/2002 | Haghighi et al. | 710/1 |
| 6,438,668 B1 | 8/2002 | Esfahani et al. | 711/165 |
| 6,446,174 B1 | 9/2002 | Dow | 711/154 |
| 6,449,308 B1 | 9/2002 | Knight, Jr. et al. | 375/212 |
| 6,453,393 B1 | 9/2002 | Holman et al. | 711/154 |
| 6,462,978 B2 | 10/2002 | Shibata et al. | 365/63 |
| 6,463,059 B1 | 10/2002 | Movshovich et al. | 370/389 |
| 6,470,422 B2 | 10/2002 | Cai et al. | 711/129 |
| 6,473,828 B1 | 10/2002 | Matsui | 711/104 |
| 6,477,592 B1 | 11/2002 | Chen et al. | 710/52 |
| 6,477,614 B1 | 11/2002 | Leddige et al. | 711/5 |
| 6,477,621 B1 | 11/2002 | Lee et al. | 711/120 |
| 6,479,322 B2 | 11/2002 | Kawata et al. | 438/109 |
| 6,487,648 B1 | 11/2002 | Hassoun | 711/167 |
| 6,490,188 B2 | 12/2002 | Nuxoll et al. | 365/63 |
| 6,493,803 B1 | 12/2002 | Pham et al. | 711/147 |
| 6,496,909 B1 | 12/2002 | Schimmel | 711/163 |
| 6,501,471 B1 | 12/2002 | Venkataraman et al. | 345/424 |
| 6,505,287 B2 | 1/2003 | Uematsu | 711/170 |
| 6,523,092 B1 | 2/2003 | Fanning | 711/134 |
| 6,523,093 B1 | 2/2003 | Bogin et al. | 711/137 |
| 6,539,490 B1 | 3/2003 | Forbes et al. | 713/401 |
| 6,552,564 B1 | 4/2003 | Forbes et al. | 326/30 |
| 6,564,329 B1 | 5/2003 | Cheung et al. | 713/322 |
| 6,587,912 B2 | 7/2003 | Leddige et al. | 711/5 |
| 6,590,816 B2 | 7/2003 | Perner | 365/200 |
| 6,594,713 B1 | 7/2003 | Fuoco et al. | 710/31 |
| 6,594,722 B1 | 7/2003 | Willke, II et al. | 710/313 |
| 6,598,154 B1 | 7/2003 | Vaid et al. | 712/237 |
| 6,615,325 B2 | 9/2003 | Mailloux et al. | 711/154 |

| | | | |
|---|---|---|---|
| 6,622,227 B2 | 9/2003 | Zumkehr et al. ............. 711/167 |
| 6,625,702 B2 | 9/2003 | Rentschler et al. .......... 711/154 |
| 6,628,294 B1 | 9/2003 | Sadowsky et al. .......... 345/568 |
| 6,629,220 B1 | 9/2003 | Dyer ........................ 711/158 |
| 6,631,440 B2 | 10/2003 | Jenne et al. ................. 711/105 |
| 6,636,110 B1 | 10/2003 | Ooishi et al. ................ 327/565 |
| 6,646,929 B1 | 11/2003 | Moss et al. ................. 365/194 |
| 6,658,509 B1 | 12/2003 | Bonella et al. ............. 710/100 |
| 6,662,304 B2 | 12/2003 | Keeth et al. ................. 713/400 |
| 6,665,202 B2 | 12/2003 | Lindahl et al. ............... 365/49 |
| 6,667,895 B2 | 12/2003 | Jang et al. ..................... 365/63 |
| 6,675,117 B2 | 1/2004 | Adam et al. ................ 702/106 |
| 6,681,292 B2 | 1/2004 | Creta et al. ................. 711/119 |
| 6,697,926 B2 | 2/2004 | Johnson et al. ............. 711/167 |
| 6,715,018 B2 | 3/2004 | Farnworth et al. ......... 710/300 |
| 6,718,440 B2 | 4/2004 | Maiyuran et al. ............ 711/137 |
| 6,721,195 B2 | 4/2004 | Brunelle et al. .............. 365/63 |
| 6,724,685 B2 | 4/2004 | Braun et al. ................. 365/233 |
| 6,728,800 B1 | 4/2004 | Lee et al. ...................... 710/54 |
| 6,732,203 B2 | 5/2004 | Kanapathippillai et al. ... 710/66 |
| 6,735,679 B1 | 5/2004 | Herbst et al. ................. 711/167 |
| 6,735,682 B2 | 5/2004 | Segelken et al. ............. 711/220 |
| 6,745,275 B2 | 6/2004 | Chang ........................ 710/104 |
| 6,751,703 B2 | 6/2004 | Chilton ...................... 711/113 |
| 6,754,117 B2 | 6/2004 | Jeddeloh ..................... 365/201 |
| 6,754,812 B1 | 6/2004 | Abdallah et al. ............. 712/234 |
| 6,756,661 B2 | 6/2004 | Tsuneda et al. .............. 257/673 |
| 6,760,833 B1 | 7/2004 | Dowling ...................... 712/34 |
| 6,771,538 B2 | 8/2004 | Shukuri et al. ......... 365/185.05 |
| 6,775,747 B2 | 8/2004 | Venkatraman .............. 711/137 |
| 6,782,465 B1 | 8/2004 | Schmidt ..................... 711/208 |
| 6,789,173 B1 | 9/2004 | Tanaka et al. ................ 711/147 |
| 6,792,059 B2 | 9/2004 | Yuan et al. .................. 375/354 |
| 6,792,496 B2 | 9/2004 | Aboulenein et al. ......... 710/306 |
| 6,795,899 B2 | 9/2004 | Dodd et al. .................. 711/137 |
| 6,799,246 B1 | 9/2004 | Wise et al. ................... 711/117 |
| 6,799,268 B1 | 9/2004 | Boggs et al. ................. 712/228 |
| 6,804,760 B2 | 10/2004 | Wiliams ...................... 711/170 |
| 6,804,764 B2 | 10/2004 | LaBerge et al. .............. 711/170 |
| 6,807,630 B2 | 10/2004 | Lay et al. ....................... 713/2 |
| 6,811,320 B1 | 11/2004 | Abbott ........................ 385/58 |
| 6,816,947 B1 | 11/2004 | Huffman .................... 711/151 |
| 6,820,181 B2 | 11/2004 | Jeddeloh et al. ............. 711/169 |
| 6,821,029 B1 | 11/2004 | Grung et al. .................. 385/92 |
| 6,823,023 B1 | 11/2004 | Hannah ....................... 375/296 |
| 6,832,306 B1 | 12/2004 | Ganapathy et al. ............ 712/41 |
| 6,845,409 B1 | 1/2005 | Talagala et al. ............... 710/20 |
| 6,880,117 B2 | 4/2005 | Lin et al. ..................... 714/718 |
| 6,889,304 B2 | 5/2005 | Perego et al. ................ 711/170 |
| 6,910,109 B2 | 6/2005 | Holman et al. .............. 711/156 |
| 6,948,094 B2 * | 9/2005 | Schultz et al. ................ 714/15 |
| 6,970,968 B1 | 11/2005 | Holman ........................ 711/5 |
| 6,972,981 B2 | 12/2005 | Ruckerbauer et al. ......... 365/63 |
| 7,036,055 B2 | 4/2006 | Muljono et al. ............. 714/716 |
| 7,155,645 B1 | 12/2006 | Korhonen ................... 714/718 |
| 7,191,088 B1 | 3/2007 | Reed et al. .................. 702/130 |
| 7,210,059 B2 | 4/2007 | Jeddeloh |
| 7,216,196 B2 | 5/2007 | Jeddeloh ........................ 711/5 |
| 7,278,060 B2 | 10/2007 | Jeddeloh ..................... 714/42 |
| 7,310,748 B2 * | 12/2007 | Jeddeloh ..................... 714/42 |
| 7,310,752 B2 | 12/2007 | Jeddeloh ..................... 714/718 |
| 7,360,011 B2 | 4/2008 | Jeddeloh ........................ 711/5 |
| 7,516,363 B2 | 4/2009 | Jeddeloh ..................... 714/31 |
| 7,584,336 B2 * | 9/2009 | Tremaine .................... 711/155 |
| 2001/0013110 A1 | 8/2001 | Pierce et al. ................. 714/718 |
| 2001/0039612 A1 | 11/2001 | Lee .............................. 713/2 |
| 2002/0013881 A1 | 1/2002 | Delp et al. ................... 711/105 |
| 2002/0023203 A1 | 2/2002 | Cofler et al. ................. 712/227 |
| 2002/0046379 A1 | 4/2002 | Miki et al. ................... 714/749 |
| 2002/0056063 A1 | 5/2002 | Nerl ........................... 714/733 |
| 2002/0062466 A1 | 5/2002 | Noguchi ..................... 714/738 |
| 2002/0066052 A1 | 5/2002 | Olarig et al. ................... 714/42 |
| 2002/0089925 A1 | 7/2002 | Smith et al. .................. 370/216 |
| 2002/0104043 A1 | 8/2002 | Reynolds et al. .............. 714/38 |
| 2002/0104045 A1 | 8/2002 | Cooper ........................ 714/42 |
| 2002/0112119 A1 | 8/2002 | Halbert et al. ............. 711/115 |
| 2002/0116081 A1 | 8/2002 | Wood et al. ................... 700/87 |
| 2002/0116588 A1 | 8/2002 | Beckert et al. ............. 711/161 |
| 2002/0144064 A1 | 10/2002 | Fanning ...................... 711/144 |
| 2002/0194558 A1 | 12/2002 | Wang et al. ................. 714/718 |
| 2002/0199136 A1 | 12/2002 | Ku .............................. 714/30 |
| 2002/0199139 A1 | 12/2002 | Dortu et al. ................. 714/718 |
| 2003/0005223 A1 | 1/2003 | Coulson et al. ............. 711/118 |
| 2003/0043158 A1 | 3/2003 | Wasserman et al. ......... 345/545 |
| 2003/0043426 A1 | 3/2003 | Baker et al. ................. 359/109 |
| 2003/0046628 A1 | 3/2003 | Rankin et al. ............... 714/752 |
| 2003/0056038 A1 | 3/2003 | Cochran ...................... 710/36 |
| 2003/0074601 A1 * | 4/2003 | Schultz et al. ................ 714/15 |
| 2003/0093630 A1 | 5/2003 | Richard et al. .............. 711/154 |
| 2003/0149809 A1 | 8/2003 | Jensen et al. ................. 710/22 |
| 2003/0163649 A1 | 8/2003 | Kapur et al. ................. 711/146 |
| 2003/0177320 A1 | 9/2003 | Sah et al. ..................... 711/158 |
| 2003/0193927 A1 | 10/2003 | Hronik ........................ 370/351 |
| 2003/0217223 A1 | 11/2003 | Nino, Jr. et al. ............. 711/105 |
| 2003/0227798 A1 | 12/2003 | Pax ......................... 365/189.12 |
| 2003/0229770 A1 | 12/2003 | Jeddeloh ..................... 711/213 |
| 2003/0233601 A1 | 12/2003 | Vaid et al. ..................... 714/42 |
| 2004/0022094 A1 | 2/2004 | Radhakrishnan et al. ..... 365/200 |
| 2004/0044833 A1 | 3/2004 | Ryan ............................ 711/5 |
| 2004/0122911 A1 | 6/2004 | Chong, Jr. et al. ........... 709/217 |
| 2004/0123043 A1 | 6/2004 | Rotithor et al. .............. 711/137 |
| 2004/0123180 A1 | 6/2004 | Soejima et al. ................. 714/5 |
| 2004/0126115 A1 | 7/2004 | Levy et al. .................. 398/116 |
| 2004/0128433 A1 | 7/2004 | Bains ......................... 711/106 |
| 2004/0144994 A1 | 7/2004 | Lee et al. ..................... 257/200 |
| 2004/0199843 A1 | 10/2004 | Hansquine et al. .......... 714/733 |
| 2004/0216018 A1 | 10/2004 | Cheung ...................... 714/724 |
| 2004/0236885 A1 | 11/2004 | Fredriksson et al. ........ 710/100 |
| 2004/0237001 A1 | 11/2004 | Schulz et al. ................. 714/42 |
| 2005/0021884 A1 | 1/2005 | Jeddeloh ....................... 710/22 |
| 2005/0044327 A1 | 2/2005 | Howard et al. .............. 711/147 |
| 2005/0060600 A1 | 3/2005 | Jeddeloh ........................ 714/5 |
| 2005/0066113 A1 | 3/2005 | Rajamony et al. ........... 711/105 |
| 2005/0071542 A1 | 3/2005 | Weber et al. ................ 711/105 |
| 2005/0210185 A1 * | 9/2005 | Renick ........................ 711/105 |
| 2005/0243829 A1 * | 11/2005 | Spencer ...................... 370/394 |
| 2006/0075282 A1 | 4/2006 | Borkenhagen et al. ......... 714/5 |
| 2006/0206761 A1 | 9/2006 | Jeddeloh ..................... 714/29 |
| 2006/0206766 A1 | 9/2006 | Jeddeloh ..................... 714/42 |
| 2008/0140904 A1 | 6/2008 | Jeddeloh ..................... 710/317 |
| 2009/0106591 A1 | 4/2009 | Jeddeloh ..................... 714/31 |

FOREIGN PATENT DOCUMENTS

| | | |
|---|---|---|
| JP | 2001265539 A | 9/2001 |
| KR | 2006/021440 A | 3/2006 |
| WO | WO 93/19422 | 9/1993 |
| WO | WO 02/27499 A2 | 4/2002 |

OTHER PUBLICATIONS

Intel, "Flash Memory PCI Add-In Card for Embedded Systems", Application Note AP-758, Sep. 1997, pp. i-13.

Intel, "Intel 840 Chipset: 82840 Memory Controller Hub (MCH)", Datasheet, www.intel.com/design/chipsets/datashts/298020.htm, Oct. 1999, pp. 1-178.

Micron Technology, Inc., "Synchronous DRAM Module 512MB/1GB (x72, ECC) 168-PIN Registered FBGA SDRAM DIMM", Micron Technology, Inc., 2002, pp. 1-23.

Shanley, T. et al., "PCI System Architecture", Third Edition, Mindshare, Inc., 1995, pp. 24-25.

* cited by examiner

MEMORY HUB TESTER INTERFACE AND METHOD FOR USE THEREOF

CROSS-REFERENCE TO RELATED APPLICATION

This application is a continuation of U.S. patent application Ser. No. 10/861,163, filed Jun. 4, 2004, and issued as U.S. Pat. No. 7,310,748 B2 on Dec. 18, 2007. This application and patent are each incorporated by reference herein.

TECHNICAL FIELD

The present invention relates to systems and methods for testing memory devices, and more particularly, to systems and methods for testing memory devices through a system bridge to enable the use of a relatively low-speed tester to test higher speed memory devices.

BACKGROUND OF THE INVENTION

Computer systems use memory devices, such as dynamic random access memory ("DRAM") devices, to store data that are accessed by a processor. These memory devices are normally used as system memory in a computer system. In a typical computer system, the processor communicates with the system memory through a processor bus and a memory controller. The memory devices of the system memory, typically arranged in memory modules having multiple memory devices, are coupled through a memory bus to the memory controller. The processor issues a memory request, which includes a memory command, such as a read command, and an address designating the location from which data or instructions are to be read. The memory controller uses the command and address to generate appropriate command signals as well as row and column addresses, which are applied to the system memory through the memory bus. In response to the commands and addresses, data are transferred between the system memory and the processor. The memory controller is often part of a system controller, which also includes bus bridge circuitry for coupling the processor bus to an expansion bus, such as a PCI bus.

In memory systems, high data bandwidth is desirable. Generally, bandwidth limitations are not related to the memory controllers since the memory controllers sequence data to and from the system memory as fast as the memory devices allow. One approach that has been taken to increase bandwidth is to increase the speed of the memory data bus coupling the memory controller to the memory devices. Thus, the same amount of information can be moved over the memory data bus in less time. However, despite increasing memory data bus speeds, a corresponding increase in bandwidth does not result. One reason for the non-linear relationship between data bus speed and bandwidth is the hardware limitations within the memory devices themselves. That is, the memory controller has to schedule all memory commands to the memory devices such that the hardware limitations are honored. Although these hardware limitations can be reduced to some degree through the design of the memory device, a compromise must be made because reducing the hardware limitations typically adds cost, power, and/or size to the memory devices, all of which are undesirable alternatives. Thus, given these constraints, although it is easy for memory devices to move "well-behaved" traffic at ever increasing rates, for example, sequel traffic to the same page of a memory device, it is much more difficult for the memory devices to resolve "badly-behaved traffic," such as bouncing between different pages or banks of the memory device. As a result, the increase in memory data bus bandwidth does not yield a corresponding increase in information bandwidth.

In addition to the limited bandwidth between processors and memory devices, the performance of computer systems is also limited by latency problems that increase the time required to read data from system memory devices. More specifically, when a memory device read command is coupled to a system memory device, such as a synchronous DRAM ("SDRAM") device, the read data are output from the SDRAM device only after a delay of several clock periods. Therefore, although SDRAM devices can synchronously output burst data at a high data rate, the delay in initially providing the data can significantly slow the operating speed of a computer system using such SD RAM devices. Increasing the memory data bus speed can be used to help alleviate the latency issue. However, as with bandwidth, the increase in memory data bus speeds do not yield a linear reduction of latency, for essentially the same reasons previously discussed.

Although increasing memory data bus speed has, to some degree, been successful in increasing bandwidth and reducing latency, other issues are raised by this approach. For example, as the speed of the memory data bus increases, loading on the memory bus needs to be decreased in order to maintain signal integrity since traditionally, there has only been wire between the memory controller and the memory slots into which the memory modules are plugged. Several approaches have been taken to accommodate the increase in memory data bus speed. For example, reducing the number of memory slots, adding buffer circuits on a memory module in order to provide sufficient fanout of control signals to the memory devices on the memory module, and providing multiple memory device interfaces on the memory module since there are too few memory module connectors on a single memory device interface. The effectiveness of these conventional approaches are, however, limited. A reason why these techniques were used in the past is that it was cost-effective to do so. However, when only one memory module can be plugged in per interface, it becomes too costly to add a separate memory interface for each required memory slot. In other words, it pushes the system controllers package out of the commodity range and into the boutique range, thereby, greatly adding cost.

Figure 1:
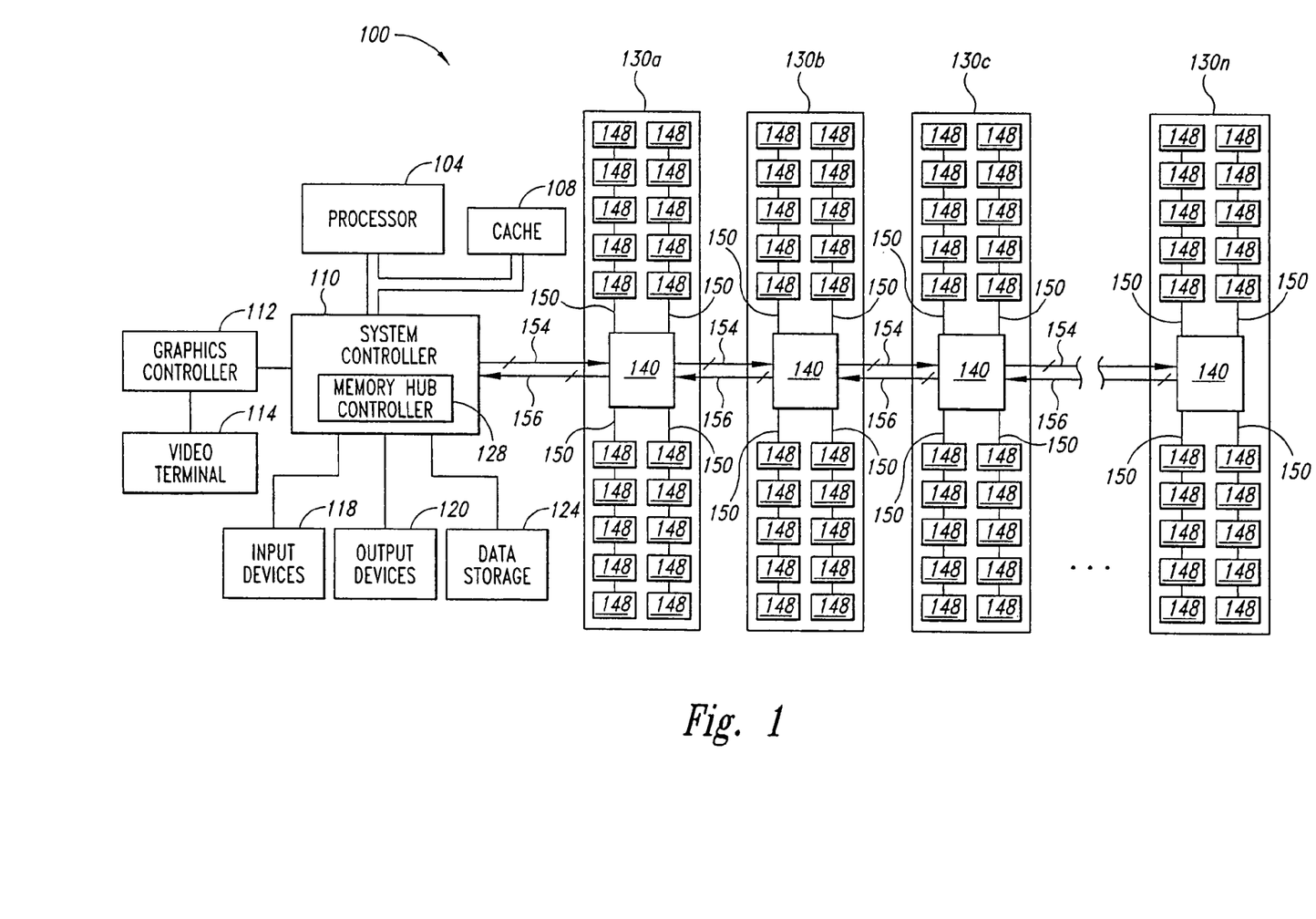
FIG. 1 is a partial block diagram of a processor-based system having system memory that uses a conventional memory hub architecture.

One recent approach that allows for increased memory data bus speed in a cost effective manner is the use of multiple memory devices coupled to the processor through a memory hub. A computer system 100 shown in FIG. 1 uses a memory hub architecture. The computer system 100 includes a processor 104 for performing various computing functions, such as executing specific software to perform specific calculations or tasks. The processor 104 includes a processor bus 106 that normally includes an address bus, a control bus, and a data bus. The processor bus 106 is typically coupled to cache memory 108, which, is typically static random access memory ("SRAM"). Finally, the processor bus 106 is coupled to a system controller 110, which is also sometimes referred to as a bus bridge. The system controller 110 serves as a communications path to the processor 104 for a variety of other components. For example, as shown in FIG. 1, the system controller 110 includes a graphics port that is typically coupled to a graphics controller 112, which is, in turn, coupled to a video terminal 114. The system controller 110 is also coupled to one or more input devices 118, such as a keyboard or a mouse, to allow an operator to interface with the computer system 100. Typically, the computer system 100 also includes one or more output devices 120, such as a printer, coupled to the processor 104 through the system controller 110. One or more data storage devices 124 are also typically coupled to the processor 104 through the system controller 110 to allow the processor 104 to store data or retrieve data from internal or external storage media (not shown). Examples of typical storage devices 124 include hard and floppy disks, tape cassettes, and compact disk read-only memories (CD-ROMs).

The system controller 110 includes a memory hub controller 128 that is coupled to the processor 104. The system controller 110 is further coupled over a high speed bi-directional or unidirectional system controller/hub interface 134 to several memory modules 130*a-n*. Typically, the memory modules 130*a-n* are coupled in a point-to-point or daisy chain architecture such that the memory modules 130*a-n* are connected one to another in series. Thus, the system controller 110 is coupled to a first memory module 130*a*, with the first memory module 130*a* connected to a second memory module 130*b*, and the second memory module 130*b* coupled to a third memory module 130*c*, and so on in a daisy chain fashion. Each memory module 130*a-n* includes a memory hub 140 that is coupled to the system controller/hub interface 134, and is further coupled a number of memory devices 148 through command, address and data buses, collectively shown as bus 150. The memory hub 140 efficiently routes memory requests and responses between the memory hub controller 128 and the memory devices 148.

The memory devices 148 on the memory modules 130*a-n* are typically capable of operating at high clock frequencies in order to facilitate the relatively high speed operation of the overall memory system. Consequently, computer systems employing this architecture can also use the high-speed system controller/hub interface 134 to complement the high clock speeds of the memory devices 148. Additionally, with a memory hub based system, signal integrity can be maintained on the system controller/hub interface 134 since the signals are typically transmitted through multiple memory hubs 140 to and from the memory hub controller 128. Moreover, this architecture also provides for easy expansion of the system memory without concern for degradation in signal quality as more memory modules are added, such as occurs in conventional memory bus architectures.

It will be appreciated that testing the memory devices 148 of the memory modules 130*a-n* typically requires the use of test equipment that can accommodate the high clock frequencies under which the memory devices 148 operate. That is, the testers, test interface equipment, and the like are designed to perform various tests on the memory devices 148 to determine the functionality of the devices under typical operating conditions. For example, testers should be able to generate test signals, such as command, address, and data signals, with sufficient signal accuracy and at least at the speed under which the memory devices 148 operate in order to perform meaningful testing. Additionally, the tester should preferably be able to analyze the relative timing margin for various aspects of the memory devices 148 in operation, which typically requires the tester to operate at clock frequencies higher than which the memory devices 148 operate. Although such test equipment is available, the economic costs to purchase this equipment is often very high. The burden is greatly increased in a manufacturing setting, where multiple test equipment is required to maintain adequate production throughput. Consequently, if the costs of the test equipment are prohibitive, the quality of memory device testing will be compromised or production output will suffer, neither of which is a desirable solution. Therefore, there is a need for systems and methods that provide alternative approaches to testing memory devices.

SUMMARY OF THE INVENTION

A memory hub according to one aspect of the invention includes a memory test bridge circuit having a tester interface through which test command packets are received responsive to a test clock signal and further having a memory interface coupled to the tester interface through which memory commands corresponding to a test command packet are provided to at least one memory device responsive to a memory clock signal. The memory hub further includes an error detect circuit coupled to the memory test bridge circuit for comparing expected data received by the memory test bridge circuit to read data returned from the memory device in response to a memory command, the error detect circuit operable to generate in response to the comparison pass/fail data indicative of whether the read data matches the expected data.

In another aspect of the invention, a method for testing a memory device is provided including coupling test command packets from a tester to a memory hub responsive to a test clock signal having a test clock frequency, generating in the memory hub memory device command, address, and data signals in accordance with the test command packets, and coupling the memory device command, address, and data signals from the memory hub to a memory device under test responsive to a memory device clock signal having a memory device clock frequency.

DETAILED DESCRIPTION OF THE INVENTION

Figure 2:
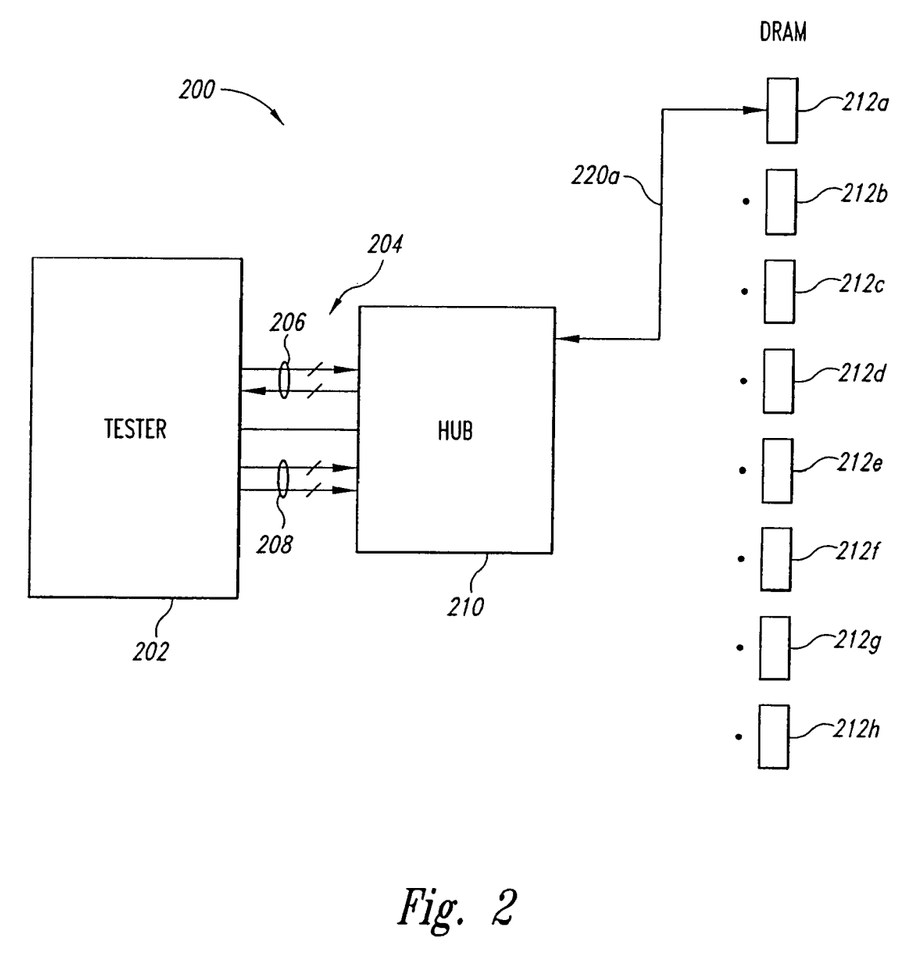
FIG. 2 is a partial block diagram of a test apparatus for testing memory device having a memory hub according to an embodiment of the present invention.

FIG. 2 illustrates a memory device test arrangement 200 according to an embodiment of the present invention. A conventional tester 202, as known in the art, is coupled to a memory hub 210 through a tester/memory hub bus 204. The tester/memory hub bus 204 includes an uplink bus 208 coupled to the hub 210 through which test command packets are provided to the memory hub 210, and further includes a test control bus 206 through which the testing can be controlled and monitored as well as through which test results can be obtained. The memory hub is coupled to a plurality of memory devices 212*a-h* through respective memory busses 220*a-h*. As will be described in more detail below, the test command packets provided by the tester 202 to the memory hub 210 include information for performing testing of the memory devices 212*a-h*, such as memory commands, test addresses, test data, and the like. Although the memory hub 210 is shown in FIG. 2 as being coupled to each of the memory devices 212*a-h* through a respective memory bus 220*a-h*, it will be appreciated that the memory hub 210 and memory devices 212*a-h* can be coupled through a common memory bus (not shown) as well. The memory busses 220*a-h* include signal lines for coupling memory addresses, memory commands, and data between the memory hub 210 and the memory devices 212*a-h*.

As will be explained in greater detail below, the memory hub 210 acts as a "test bridge" between the tester 202 and the memory devices 212*a-h*. In this manner, a tester having a maximum operating clock frequency that is less than that of the operating clock frequency of the memory devices 212*a-h* can still be used to test the memory devices 212*a-h* at their operating clock frequency. Generally, the tester 202 drives test patterns to various degrees, and the memory hub 210 drives the high speed interface electronics coupled to the memory devices 212*a-h*.

Figure 3:
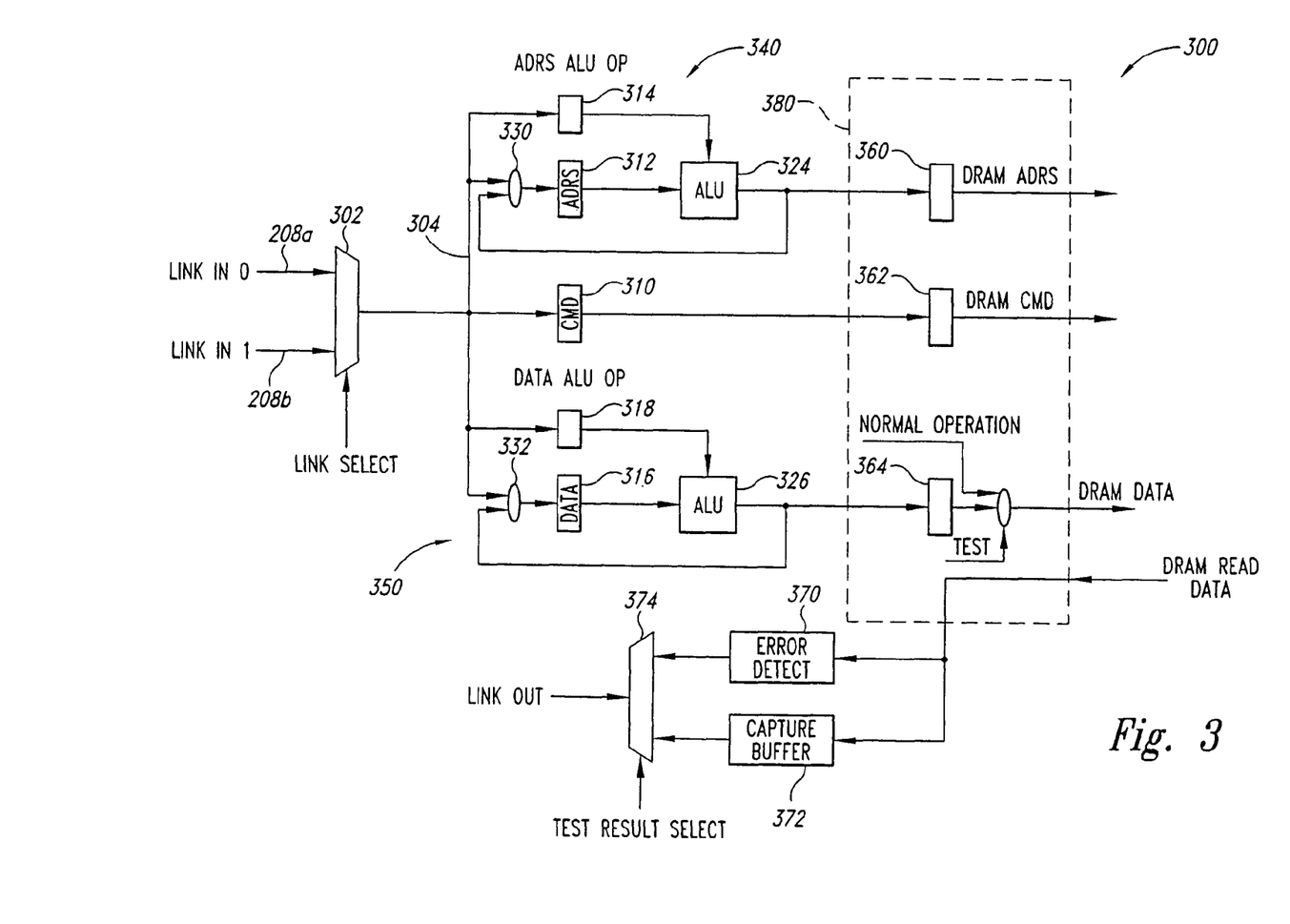
FIG. 3 is a partial block diagram of a memory hub according to an embodiment of the present invention.

FIG. 3 illustrates a portion of a memory hub 300. The memory hub 300 can be substituted for the memory hub 210 shown in FIG. 2. A multiplexer 302 is coupled to the uplink bus 208, which is shown in FIG. 3 as having a first uplink LINKIN0 208*a* and a second uplink LINKIN1 208*b*. The multiplexer 302 selects between the uplink 208*a* and 208*b* to be coupled to a memory hub test command bus 304. Coupled to the memory hub test command bus 304 are test command latch 310, test address latch 312 and test address opcode latch 314, and test data latch 316 and test data opcode latch 318. The latches 310, 312, 314, 316, 318 are conventional, and as will be explained in more detail below, latch various signals of the test command packet provided to the memory hub 210 from the tester 202 (FIG. 2).

A test address arithmetic and logic unit (ALU) 324 coupled to the test address latch 312 performs arithmetic and logical operations on test addresses according to a test address opcode latched by the test address opcode latch 314. As will be explained in more detail below, the test address opcode is provided to the memory hub 300 as part of the test command packet. The output of the test address ALU 324 is coupled back through a multiplexer 330 to the test address latch 312 in the event the test address ALU 324 is instructed to perform operations on a test address resulting from a previous test address ALU operation. The test address latch 312, test address opcode latch 314, the test address ALU 324, and the multiplexer 330 generally define a test address generator 340. The memory hub 210 further includes a test data ALU 326 coupled to the test data latch 316 for performing arithmetic and logical operations on test data according to a test data opcode latched by the test data opcode latch 318. As will be explained in more detail below, the test data opcode is provided to the memory hub 300 as part of the test command packet. The output of the test data ALU 326 is coupled back through a multiplexer 332 to the test data latch 316 in the event the test data ALU 326 is instructed to perform operations on test data resulting from a previous test data ALU operation. The test data latch 316, test data opcode latch 318, test data ALU 326, and the multiplexer 332 generally define a test data generator 350.

A memory address interface latch 360 is coupled to the test address ALU 324 to provide a test address to the memory devices 212*a-h* (FIG. 2). Similarly, a memory data interface latch 364 coupled to the output of the test data ALU 326 provides test data to the memory devices 212*a-h*. A memory command interface latch 362 coupled to the test command latch 310 to provide memory commands to the memory devices 212*a-h*. Each of the memory interface latches 360, 362, 364 are coupled to the corresponding signal lines of the memory busses 220*a-h*.

Also included in the memory hub 210 are error detect logic 370 and a data capture buffer 372 coupled to the data signal lines of the memory busses 220*a-h*. As shown in FIG. 3, the error detect logic 370 and the data capture buffer 372 are coupled to data bus distinct from the data bus to which the memory data interface latch 364 is coupled. However, it will be appreciated that FIG. 3 is representative, and that the data busses to which the error detect logic 370, the data capture buffer 372, and the memory data interface latch 364 are coupled can be a bi-directional bus, as known in the art. More generally, the memory interface latches 360, 362, 364 represent a memory interface circuit to which, the error detect logic 370 and the data capture buffer 372 are coupled.

The error detect logic 370 includes logic to compare the data read from the memory devices 212*a-h* with the expected data written to the memory devices 212*a-h* in order to determine whether a memory device 212*a-h* passes or fails testing. The error detect logic 370 includes test result registers (not shown) that store information indicative of the results of the comparison which are accessible to the tester 202. In this manner, the results of testing the memory devices 212*a-h* can be provided to the tester 202 when requested. A capture buffer 372 is also coupled to the data signal lines of the memory busses 220*a-h* to store read data from the memory devices 212*a-h* in the event that review of particular read data by the tester 202 is desired. For example, where an error has been detected by the error detect logic 370, it may be desirable for the tester 202 to review the particular data that caused the error by retrieving it from the capture buffer 372. A multiplexer 374 is coupled to the error detect logic 370 and the capture buffer 372 to select between providing the information indicative of test results or particular read data to the tester 202. It will be appreciated that in alternative embodiments, the information from the capture buffer 372 and the error detect logic 370 can be provided to the tester 202 directly, rather than through the multiplexer 374. Alternative arrangements for providing test results or particular read data to the tester 202 can also be utilized without departing from the scope of the present invention.

It will be appreciated that the previously described circuitry can be included in the memory hub 210 specifically for testing purposes, or alternatively, various circuits included in the memory hub 210 for normal operation can be utilized where appropriate. For example, the test command latch 310 can be replaced by a command latch used during normal operation of the memory hub 210. Similarly, the test address generator 340, although described with respect to FIG. 3 as being included for testing purposes, can be replaced by address circuitry already included in the memory hub 210 for use during normal operation. Such modifications can be made without departing from the scope of the present invention.

In operation, memory test command packets are provided to the memory hub 300 in parallel over the first and second uplink busses 208*a*, 208*b* every clock cycle of a test clock. The memory test command packets are then de-multiplexed and the test command, address, and data information included in the test command packets are latched by the corresponding test command, address, and data latches 310, 312, and 318, according to a faster memory clock frequency. The test command, address, and data information are then converted into the appropriate signals for the memory devices 212*a-h* and latched by the respective memory address, command, and data interface latches 360, 362, 364. Thus, the link interface behaves as a multiplexed memory device command bus. In this manner, a tester can provide test command packets in parallel to the memory hub 300 at a first clock frequency over the first and second uplink busses 208*a*, 208*b*, and the memory devices 212*a-h* can receive memory test commands at a second clock frequency over the memory busses 220*a-h* in order to test at a different, typically higher, clock frequency. As a result, enough test command throughput for the higher speed memory devices 212*a-h* are provided through the memory hub 300, which allows for considerable flexibility for command scheduling.

Figure 4:
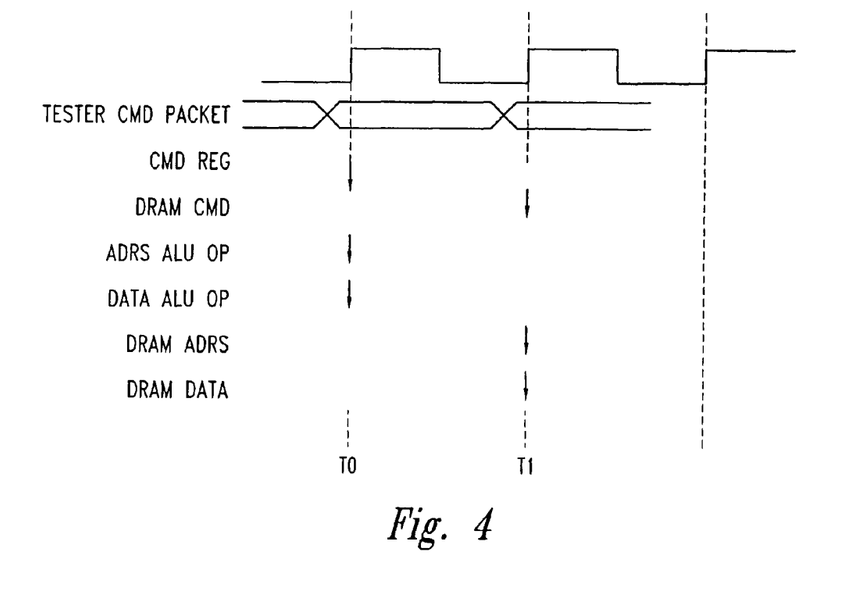
FIG. 4 is partial timing diagram for a test apparatus including a memory hub according to an embodiment of the present invention.

FIG. 4 is a timing diagram illustrating the latching of test command packets and provision to the memory interface latches 360, 362, and 364. At a time T0, the test command, address and data information included with a test command packet is latched. At a time T1, the information, now converted into the appropriate signals for the memory devices, is latched by the test address, command, and data interface latches 360, 362, 364 and provided to the memory devices 212*a-h* under test. It will be appreciated that at the time T1, although not shown in FIG. 4, the test command, address and data information for the next test command packet can be latched. Thus, the latching of test command, address, and data information, and provision of appropriate memory signals to the memory devices 212*a-h* can be interleaved so that for each clock cycle, a test command can be provided to the memory devices 212*a-h*.

As previously discussed, in response to receiving the memory test command packets, the appropriate test command, address, and data information is latched by the respective test latches, 310, 312, and 318. In the embodiment shown in FIG. 3, test memory addresses and test data may be provided as part of the test command packet. Alternatively, address ALU opcodes and test data ALU opcodes can be provided for operation of the test address ALU 324 and the test data ALU 326. That is, rather than provide the test address and test data information directly in the test command packet, the test address and test data for testing the memory devices can be generated by test address generator 340 and the test data generator 350 included in the memory hub 300.

Figure 5:
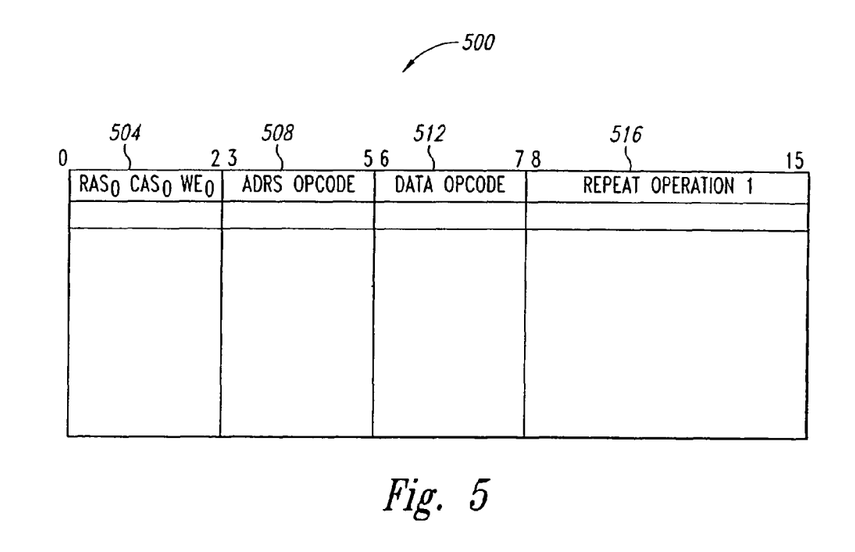
FIG. 5 is a diagram of a test command packet data structure for a memory hub according to an embodiment of the present invention.

FIG. 5 illustrates a test command packet data structure 500 that can be used with a memory hub having the test address and test data generators 340, 350. The test command packet 500 is 16-bits in length, with the three least significant bits <2:0> representing the test command field 504 for test command information, three bits <5:3> representing the test address ALU opcode field 508, two bits <7:6> representing the test data ALU opcode field 512, and eight bits <15:8> representing repeat operation field 516 for repeat operation instructions.

Various types of opcodes known in the art can be used with the test address ALU 324 and the test data ALU 326 for testing the memory devices 212*a-h*. For example, the types of opcodes that may be desirable for the test address ALU 324 include an INCREMENT command for incrementing a current address latched by the address latch 312, a DECREMENT command for decrementing a current address in the address latch 312, a COMPLEMENT command to complement the bits of a current address, a RESET command to set all the bits of a current address to zero, a SET command to set all the bits of a current address to one, and a NOOP command to not perform any operation on a current address. With respect to the opcodes for the test data ALU 326, it may be desirable to have a RESET command to set a current data value latched in the test data latch 318 to zero, a SET command to set a current data value to one, a COMPLEMENT command to complement a current data value, and a NOOP command to not perform any operation on a current data value. The types of instructions that may be desirable for the repeat operation field 516 can include instructions such as NO_REPEAT to carry out the test address and data operations only once, REPEAT_n to repeat the test address and data operations n times, n being a value provided with the repeat operation instruction, REPEAT_CONTINUE to repeat the test address and data operations indefinitely, and REPEAT_STOP to discontinue repeating the test address and data operations. Programming such opcodes and repeat operation instructions are well known in the art, and can be implemented using conventional hardware and software designs.

It will be appreciated that the particular embodiment of the memory test command packet illustrated in FIG. 5 has been provided by way of an example, and that the particular fields 504, 508, 512, 516 included in a memory test command packet 500, as well as the bit-length of the fields 504, 508, 512, 516, can be modified without departing from the scope of the present invention. Moreover, the types of opcodes that can be used for the test address ALU 324 and the test data ALU 326 and the repeat operation instructions are generally known to those ordinarily skilled in the art, and consequently, the opcodes and repeat operation instructions described herein for particular embodiments of the present invention can be modified without departing from the scope of the present invention.

Figure 6:
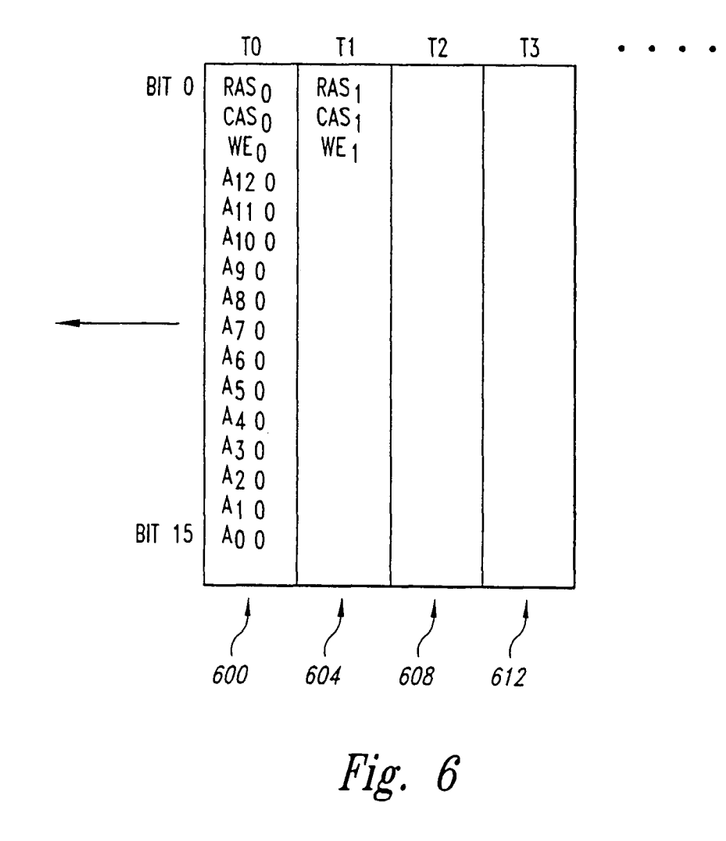
FIG. 6 is a diagram of a test command packet data structure for a memory hub according to another embodiment of the present invention.

FIG. 6 illustrates a test command packet 600 for an alternative embodiment of a memory hub 210 (FIG. 2) having memory device test capabilities. As shown in FIG. 6, the test command packet 600 is 16-bits, with the three least significant bits <2:0> representing the memory commands for the memory devices 212*a-h*, and the remaining 13-bits <15:3> representing a 13-bit memory address for the memory devices 212*a-h*. Test data is provided to the memory hub 210, and further onto the memory devices 212*a-h* in a conventional manner. That is, the test data, when appropriate, is provided to the memory hub 210 over the uplink bus 208. The memory hub 210, which receives the test data, along with the test command packet 600, forwards the test data onto the memory devices 212*a-h* using the respective memory busses 220*a-h*. In contrast to the embodiment of the memory hub 300 shown in FIG. 3, rather than provide a test command packet having a test command, and instructions for generating test addresses and test data in the memory hub 300, the test command packet 600 provides the test command and the test address directly to the memory hub, which is then translated into the appropriate signals for testing the memory devices 212*a-h*. As further shown in FIG. 6, the test command packet 600 is latched by the memory hub 210 at a time T0, with a next test command packet 604 latched the next clock cycle at a time T1. Test command packets 608 and 612 are latched at the next two clock cycles at times T2 and T3. Thus, as shown in FIG. 6, a test command packet can be provided to the memory device 212*a-h* at each clock cycle. As previously discussed with respect to the memory hub 300, test command packets having the format shown in FIG. 6 are provided to the memory hub in parallel over the first and second uplink busses 208*a*, 208*b* every clock cycle of a tester clock signal. The memory test commands are then de-multiplexed and provided to the memory devices 212*a-h* by the memory hub according to a memory clock signal having a second, typically higher, clock frequency. In this manner, the memory devices 212*a-h* can be tested at a higher frequency memory clock signal, although the tester 202 is providing the test command packets to the memory hub 210 according to a lower frequency test clock signal.

In an alternative embodiment, at least one of the test address and test data generators is included in the memory hub 210 (FIG. 2), with the test command packet including test ALU commands for the test generator that is present in the memory hub 210, and the test command packet further including the other test information to be provided directly to the memory hub 210.

Figure 7:
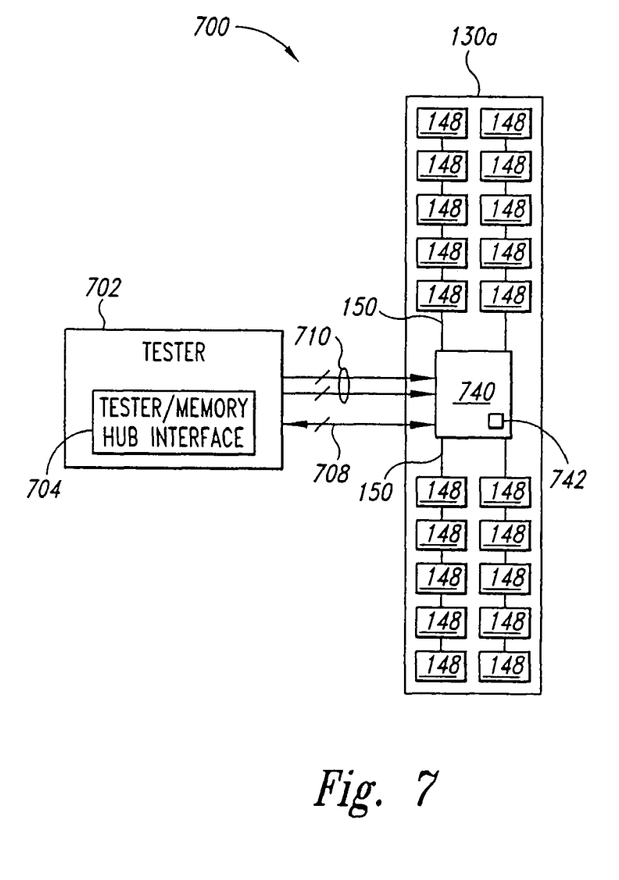
FIG. 7 is a partial block diagram of a test apparatus for testing a memory module for use in a hub-based memory system having a memory hub according to an embodiment of the present invention.

FIG. 7 illustrates a test apparatus 700 for testing memory devices 148 of a memory module 130 for use in a hub-based memory system. The test apparatus 700 includes a memory tester 702 having a tester/memory hub interface circuit 704. The memory tester 702 is coupled to a memory hub 740 located on the memory module 130 through a test control bus 708 and an test uplink bus 710. The memory hub 740 is coupled to the memory devices 148 through memory device command, address and data buses, collectively shown as busses 150. The memory hub 740 includes memory test circuits 742 according to embodiments of the present invention for testing the memory devices 148. The memory devices 148 are tested according to a memory device clock signal although the memory hub 740 receives test command packets over the test uplink bus 710 according to a tester clock signal. The tester clock signal has a first clock frequency and the memory device clock signal has a second clock frequency that is generally higher than the first clock frequency.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A memory hub, comprising:
    a memory test bridge circuit having a tester interface through which test command packets are received responsive to a test clock signal and further having a memory interface coupled to the tester interface through which memory commands corresponding to a test command packet are provided to at least one memory device responsive to a memory clock signal; and
    an error detect circuit coupled to the memory test bridge circuit for comparing expected data received by the memory test bridge circuit to read data returned from the memory device in response to a memory command, the error detect circuit operable to generate in response to the comparison pass/fail data indicative of whether the read data matches the expected data.

2. The memory hub of claim 1 wherein the test command packet comprises at least one of:
    a first packet including test command, test address, and test data signals, the test address signals representative of a memory device address and the test data signals representative of memory device data;
    a second packet including test command and test address ALU opcode signals, the test address ALU opcode signals representative of at least one of arithmetic and logic operations performed to generate memory device address signals; and
    test command and test data ALU opcode signals, the test data ALU opcode signals representative of at least one of arithmetic and logic operations performed to generate memory device data signals.

3. The memory hub of claim 1, further comprising a capture buffer coupled to the memory test bridge circuit, the capture buffer configured to capture data read from the memory device and provide the same when requested.

4. The memory hub of claim 1 wherein the memory test bridge circuit is coupled to a plurality of uplinks on which a plurality of test command packets are received by the memory test bridge concurrently.

5. The memory hub of claim 1 wherein the memory test bridge circuit includes a test address generator comprising:
    a test address latch to latch test address information;
    a test address arithmetic and logic unit (ALU) opcode latch to latch a test address ALU opcode included with the test command packet; and
    a test address ALU coupled to the test address latch and the test address ALU opcode latch for performing at least one of arithmetic and logic operations on the test address information in accordance with the test address opcode.

6. The memory hub of claim 1 wherein the memory test bridge circuit includes a test data generator comprising:
    a test data latch to latch test data information;
    a test data arithmetic and logic unit (ALU) opcode latch to latch a test data ALU opcode included with the test command packet; and
    a test data ALU coupled to the test data latch and the test data ALU opcode latch for performing at least one of arithmetic and logic operations on the test data information in accordance with the test data opcode.

7. The memory hub of claim 1 wherein the memory interface of the memory test bridge circuit comprises a memory device command latch, a memory device address latch and a memory device data latch for latching the memory device command, address, and data signals.

8. A memory module, comprising:
    a plurality of memory devices;
    a memory device bus coupled to the memory devices; and
    a memory hub coupled to the memory device bus, the memory hub comprising:
        a memory test bridge circuit having a tester interface through which test command packets are received responsive to a test clock signal and further having a memory interface coupled to the tester interface through which memory commands corresponding to a test command packet are provided to at least one memory device responsive to a memory clock signal; and
        an error detect circuit coupled to the memory test bridge circuit for comparing expected data received by the memory test bridge circuit to read data returned from the memory device in response to a memory command, the error detect circuit operable to generate in response to the comparison pass/fail data indicative of whether the read data matches the expected data.

9. The memory module of claim 8 wherein the test command packet comprises at least one of:
    a first packet including test command, test address, and test data signals, the test address signals representative of a memory device address and the test data signals representative of memory device data;
    a second packet including test command and test address ALU opcode signals, the test address ALU opcode signals representative of at least one of arithmetic and logic operations performed to generate memory device address signals; and
    test command and test data ALU opcode signals, the test data ALU opcode signals representative of at least one of arithmetic and logic operations performed to generate memory device data signals.

10. The memory module of claim 8 wherein the memory hub further comprises a capture buffer coupled to the memory test bridge circuit, the capture buffer configured to capture data read from the memory device and provide the same when requested.

11. The memory module of claim 8 wherein the memory test bridge circuit of the memory hub is coupled to a plurality of uplinks on which a plurality of test command packets are received by the memory test bridge concurrently.

12. The memory module of claim 8 wherein the memory test bridge circuit of the memory hub includes a test address generator comprising:
a test address latch to latch test address information;
a test address arithmetic and logic unit (ALU) opcode latch to latch a test address ALU opcode included with the test command packet; and
a test address ALU coupled to the test address latch and the test address ALU opcode latch for performing at least one of arithmetic and logic operations on the test address information in accordance with the test address opcode.

13. The memory module of claim 8 wherein the memory test bridge circuit of the memory hub includes a test data generator comprising:
a test data latch to latch test data information;
a test data arithmetic and logic unit (ALU) opcode latch to latch a test data ALU opcode included with the test command packet; and
a test data ALU coupled to the test data latch and the test data ALU opcode latch for performing at least one of arithmetic and logic operations on the test data information in accordance with the test data opcode.

14. The memory module of claim 8 wherein the memory interface of the memory test bridge circuit comprises a memory device command latch, a memory device address latch and a memory device data latch for latching the memory device command, address, and data signals.

15. A method for testing a memory device, comprising:
coupling test command packets from a tester to a memory hub responsive to a test clock signal having a test clock frequency;
generating in the memory hub memory device command, address, and data signals in accordance with the test command packets; and
coupling the memory device command, address, and data signals from the memory hub to a memory device under test responsive to a memory device clock signal having a memory device clock frequency.

16. The method of claim 15 wherein coupling test command packets from the tester to the memory hub comprises coupling test command, test address, and test data signals to the memory hub, the test address signals representative of a memory device address and the test data signals representative of memory device data.

17. The method of claim 15 wherein coupling test command packets from the tester to the memory hub comprises coupling test command signals, test address ALU opcode signals representative of at least one of arithmetic and logic operations performed to generate memory device address signals, and test data ALU opcode signals representative of at least one of arithmetic and logic operations performed to generate memory device data signals.

18. The method of claim 15 coupling test command packets from the tester to the memory hub comprises coupling a plurality of test command packets to the memory hub in parallel.

19. The method of claim 18 wherein generating memory device command, address, and data signals in accordance with the test command packets comprises selecting from the plurality of test command packets and generating memory device command, address, and data signals in accordance with the selected test command packet at a rate faster than the rate at which new test command packets are coupled to the memory hub in parallel.

20. The method of claim 15 wherein generating memory device address signals comprises performing at least one of arithmetic and logic operations in accordance with test address ALU opcodes included in the test command packets and wherein generating memory device data signals comprises performing at least one of arithmetic and logic operations in accordance with test data ALU opcodes included in the test command packets.

21. A method for testing a memory device, comprising:
providing test command packets to a memory hub in parallel for testing a memory device under test; and
for each command packet provided to the memory hub in parallel, generating in the memory hub memory device command, address, and data signals in accordance with the selected test command packet and providing the memory device command, address, and data signals to the memory device under test at a rate faster than which the test command packets are provided to the memory hub in parallel.

22. The method of claim 21 wherein providing test command packets from the tester to the memory hub comprises coupling test command, test address, and test data signals to the memory hub, the test address signals representative of a memory device address and the test data signals representative of memory device data.

23. The method of claim 21 wherein providing test command packets from the tester to the memory hub comprises coupling test command signals, test address ALU opcode signals representative of at least one of arithmetic and logic operations performed to generate memory device address signals, and test data ALU opcode signals representative of at least one of arithmetic and logic operations performed to generate memory device data signals.

24. The method of claim 21 wherein generating memory device address signals comprises performing at least one of arithmetic and logic operations in accordance with test address ALU opcodes included in the test command packets and wherein generating memory device data signals comprises performing at least one of arithmetic and logic operations in accordance with test data ALU opcodes included in the test command packets.

* * * * *